(12) United States Patent
Byun et al.

(10) Patent No.: US 11,791,236 B2
(45) Date of Patent: Oct. 17, 2023

(54) SEMICONDUCTOR MODULE

(71) Applicant: Samsung Electronics Co., Ltd., Suwon-si (KR)

(72) Inventors: Jaebeom Byun, Suwon-si (KR); Taehoi Hwang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 17 days.

(21) Appl. No.: 17/361,644

(22) Filed: Jun. 29, 2021

(65) Prior Publication Data

US 2022/0165640 A1    May 26, 2022

(30) Foreign Application Priority Data

Nov. 24, 2020 (KR) ........................ 10-2020-0158451

(51) Int. Cl.
    *H01L 23/38*      (2006.01)
    *H05K 7/20*      (2006.01)
    *H01L 23/12*      (2006.01)
    *H01L 23/367*      (2006.01)

(52) U.S. Cl.
    CPC .............. *H01L 23/38* (2013.01); *H01L 23/12* (2013.01); *H01L 23/3677* (2013.01); *H05K 7/20209* (2013.01)

(58) Field of Classification Search
CPC ..... H01L 23/38; H01L 23/12; H01L 23/3677; H05K 7/20209
See application file for complete search history.

(56) References Cited

U.S. PATENT DOCUMENTS

| | | | |
|---|---|---|---|
| 6,489,551 B2 | 12/2002 | Chu et al. | |
| 6,548,894 B2 | 4/2003 | Chu et al. | |
| 6,559,538 B1 | 5/2003 | Pomerene et al. | |
| 6,586,835 B1 | 7/2003 | Ahn et al. | |
| 7,603,205 B2 | 10/2009 | Barry et al. | |
| 8,546,924 B2 | 10/2013 | Yu et al. | |
| 8,649,179 B2 * | 2/2014 | Hershberger | F25B 21/02 62/3.2 |
| 8,866,309 B2 | 10/2014 | Chang et al. | |
| 9,491,865 B1 | 11/2016 | Chen et al. | |
| 9,559,283 B2 | 1/2017 | Gambino et al. | |
| 9,746,889 B2 | 8/2017 | Mittal et al. | |
| 10,504,816 B2 | 12/2019 | Beauchemin et al. | |
| 10,658,266 B2 | 5/2020 | Kim et al. | |
| 2011/0032679 A1 * | 2/2011 | Baek | H05K 7/20472 361/715 |
| 2015/0062824 A1 | 3/2015 | Hyun et al. | |
| 2016/0086917 A1 * | 3/2016 | Byun | H01L 23/3675 257/717 |

(Continued)

FOREIGN PATENT DOCUMENTS

KR      2008-0082355 A      9/2008

*Primary Examiner* — Peniel M Gumedzoe
(74) *Attorney, Agent, or Firm* — Harness, Dickey & Pierce, P.L.C.

(57) ABSTRACT

A semiconductor module may include a first PCB, at least one first semiconductor chip, a heat sink and at least one first TEC. The at least one semiconductor chip is on the first PCB. The heat sink may be configured to surround the first PCB and the at least one semiconductor control chip. The first TEC may be on the first PCB to cool heat from the first PCB. Thus, performances of the semiconductor module may not be deteriorated by the heat.

20 Claims, 15 Drawing Sheets

(56) References Cited

U.S. PATENT DOCUMENTS

2017/0103965 A1\* 4/2017 Kim .................... H01L 25/0652
2017/0229373 A1\* 8/2017 Kim ....................... H01L 35/32
2020/0089292 A1\* 3/2020 North ...................... G06F 1/206

\* cited by examiner

SEMICONDUCTOR MODULE

CROSS-RELATED APPLICATION

This application claims priority under 35 USC § 119 to Korean Patent Application No. 10-2020-0158451, filed on Nov. 24, 2020 in the Korean Intellectual Property Office (KIPO), the contents of which are herein incorporated by reference in their entirety.

BACKGROUND

1. Field

Example embodiments relate to a semiconductor module. More particularly, example embodiments relate to a semiconductor module including a control chip and memory chips.

2. Description of the Related Art

A semiconductor module may include a package substrate, a semiconductor chip such as a control chip, a plurality of memory chips, or a semiconductor package. When the semiconductor module may be operated, a large amount of heat may be generated from the control chip and the memory chips.

According to related arts, the large amount of heat may deteriorate performances of the semiconductor module. Thus, it may be required to provide the semiconductor module with a structure configured to more rapidly cool the large amount of heat generated from the control chip and the memory chips.

SUMMARY

Example embodiments provide a semiconductor module that may be capable of more rapidly cooling heat generated from a semiconductor chip or a semiconductor package.

According to example embodiments, there may be provided a semiconductor module. The semiconductor module may include a first printed circuit board (PCB), a plurality of first memory chips, a control chip, a heat sink, at least one first thermoelectric cooler (TEC), a first thermal interface material (TIM) and a first temperature sensor. The first memory chips may be on an upper surface and a lower surface of the first PCB. The control chip may be on the lower surface of the first PCB. The heat sink may be configured to surround the first PCB, the first memory chips and the control chip. The first TEC may be on the upper surface of the first PCB to cool heat from the first PCB. The first TIM may be between the first TEC and the first PCB, and between the first TEC and the heat sink. The first temperature sensor may measure a temperature of the first PCB to control operations of the first TEC. A first uneven groove may be at an inner surface of the heat sink configured to make contact with the first TEC. The first TIM may include a first uneven portion in the first uneven groove. The first TEC may have an area of no more than about 50% of an area of the first PCB.

According to example embodiments, there may be provided a semiconductor module. The semiconductor module may include a first PCB, a plurality of first memory chips, at least one control chip, heat sink and at least one first TEC. The first memory chips may be on an upper surface and a lower surface of the first PCB. The control chip may be on the lower surface of the first PCB. The heat sink may be configured to surround the first PCB, the first memory chips and the control chip. The first TEC may be on the upper surface of the first PCB to cool heat from the first PCB.

According to example embodiments, there may be provided a semiconductor module. The semiconductor module may include a first PCB, at least one first semiconductor chip, a heat sink and at least one first TEC. The at least one semiconductor chip is on the first PCB. The heat sink may be configured to surround the first PCB and the at least one semiconductor control chip. The first TEC may be on the first PCB to cool heat from the first PCB.

According to example embodiments, the first TEC may be on the first PCB to more rapidly cool the heat transferred from the semiconductor chip to the first PCB. Thus, performance of the semiconductor module may not be deteriorated by the heat.

Particularly, the first TEC may directly cool the first PCB so that the semiconductor chips connected to the first PCB may be indirectly cooled. Therefore, it may not be required to attach heat sinks to the semiconductor chips, respectively.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor module in accordance with example embodiments;

FIG. 2 is an enlarged cross-sectional view illustrating a cooling plate of a TEC of the semiconductor module in FIG. 1;

FIG. 3 is an enlarged cross-sectional view illustrating a heating plate of a TEC of the semiconductor module in FIG. 1;

FIG. 4 is a plan view illustrating a TEC of the semiconductor module in FIG. 1 on a PCB;

FIG. 5 is a cross-sectional view illustrating a semiconductor module in accordance with example embodiments;

FIG. 6 is an enlarged cross-sectional view of a portion "A" in FIG. 5;

FIG. 7 is a cross-sectional view illustrating a semiconductor module in accordance with example embodiments;

FIG. 8 is a cross-sectional view illustrating a semiconductor module in accordance with example embodiments;

FIG. 9 is a cross-sectional view illustrating a semiconductor module in accordance with example embodiments;

FIG. 10 is a cross-sectional view illustrating a semiconductor module in accordance with example embodiments;

FIG. 11 is a cross-sectional view illustrating a semiconductor module in accordance with example embodiments;

FIG. 12 is a cross-sectional view illustrating a semiconductor module in accordance with example embodiments;

FIG. 13 is a cross-sectional view illustrating a semiconductor module in accordance with example embodiments;

FIG. 14 is a cross-sectional view illustrating a semiconductor module in accordance with example embodiments;

FIG. 15 is a cross-sectional view illustrating a semiconductor module in accordance with example embodiments; and FIG. 16 is a graph showing temperatures of parts in the semiconductor module cooled by a TEC in FIG. 1.

DETAILED DESCRIPTION OF EXAMPLE EMBODIMENTS

Hereinafter, example embodiments will be explained in detail with reference to the accompanying drawings.

Figure 1:
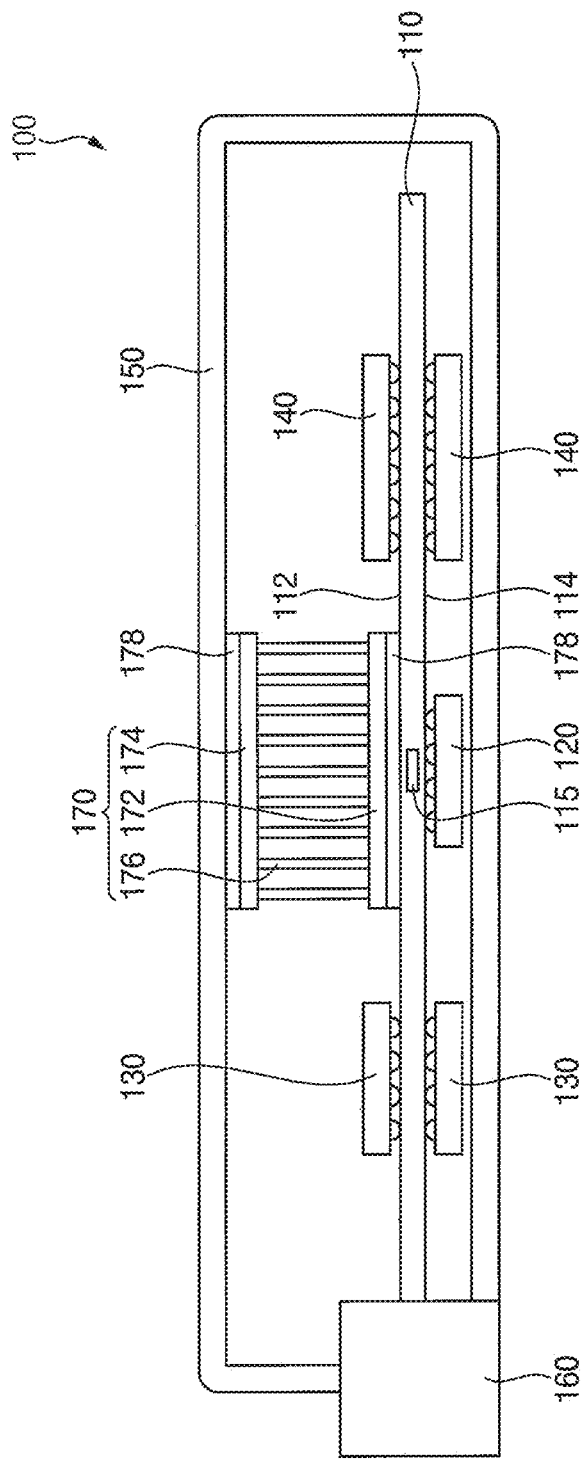
FIGS. 1 to 16 represent non-limiting, example embodiments as described herein.
Figure 2:
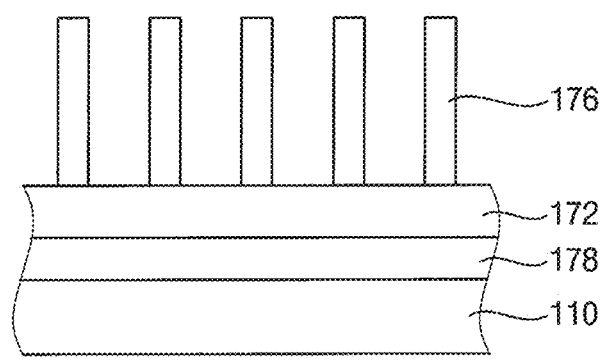
Figure 3:
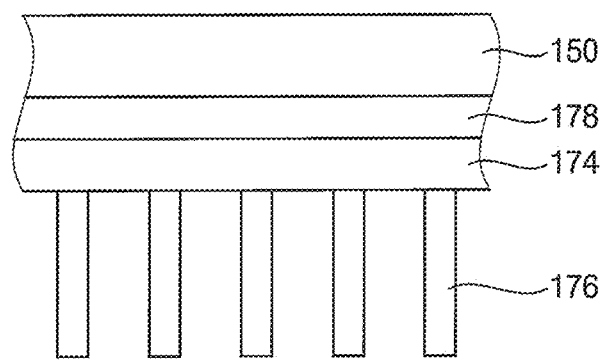
Figure 4:
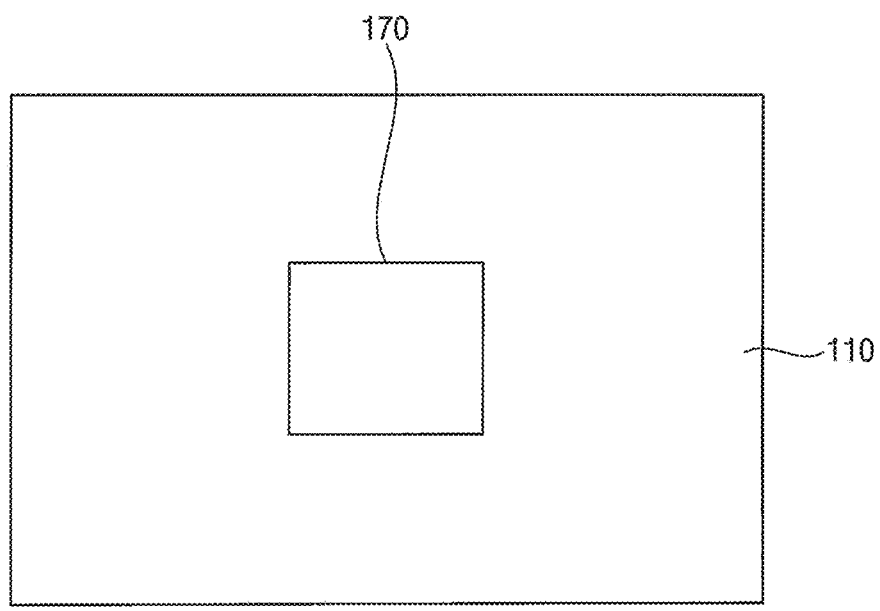

FIG. 1 is a cross-sectional view illustrating a semiconductor module in accordance with example embodiments, FIG. 2 is an enlarged cross-sectional view illustrating a cooling plate of a TEC of the semiconductor module in FIG. 1, FIG. 3 is an enlarged cross-sectional view illustrating a heating plate of a TEC of the semiconductor module in FIG. 1, and FIG. 4 is a plan view illustrating a TEC of the semiconductor module in FIG. 1 on a PCB.

Referring to FIGS. 1 to 3, a semiconductor module 100 of some example embodiments may include a solid state drive (SSD). However, the semiconductor module 100 may not be limited thereto.

The semiconductor module 100 may include a first printed circuit board (PCB) 110, a plurality of semiconductor chips 120, 130, 140, a heat sink 150, a first thermoelectric cooler (TEC) 170, a first thermal interface material (TIM) 178 and/or a first temperature sensor 115.

The first PCB 110 may have an upper surface 112 and a lower surface 114. Terminals may be arranged on the upper surface 112 and the lower surface 114 of the first PCB 110. Thus, the first PCB 110 may be used for a dual in-line memory module (DIMM). Alternatively, the terminals of the first PCB 110 may be arranged on only one of the upper surface 112 and the lower surface 114. This first PCB 110 may be used for a single in-line memory module (SIMM).

The first PCB 110 may be connected to a connector 160 configured to electrically connect the semiconductor module 100 with an external device. In example embodiments, a left end of the first PCB 110 may be connected to the connector 160.

The semiconductor chips may include a control chip 120, a plurality of memory chips, etc. The memory chips may include DRAM chips 130, NAND flash memory chips 140, etc. Alternatively, the semiconductor module 100 may include a semiconductor package.

The control chip 120 may be arranged on a central portion of the lower surface 114 of the first PCB 110. The DRAM chips 130 may be arranged on a left portion of the upper surface 112 and a left portion of the lower surface 114 in the first PCB 110. The NAND flash memory chips 140 may be arranged on a right portion of the upper surface 112 and a right portion of the lower surface 114 in the first PCB 110. Thus, heat generated from the control chip 120, the DRAM chips 130 and the NAND flash memory chips 140 during the semiconductor module 100 may be operated may be transferred to the first PCB 110. For example, when the semiconductor module 100 is operated, the largest amount of heat may be generated from the control chip 120 among the control chip 120, the DRAM chips 130 and the NAND flash memory chips 140.

The heat sink 150 may be configured to surround the first PCB 110. The heat sink 150 may be connected with the first PCB 110 via the connector 160. Thus, the heat in the first PCB 110 may be dissipated through the heat sink 150. When the semiconductor module 100 may include the SSD, the heat sink 150 may correspond to a case of the SSD.

In order to more effectively cool the heat from the first PCB 110, the first TEC 170 may be interposed between the first PCB 110 and the heat sink 150. The first TEC 170 may cool the heat from the first PCB 110 using a Peltier effect.

The first TEC 170 may include a cooling plate 172, a heating plate 174 and/or a semiconductor device 176. The cooling plate 172 and the heating plate 174 may be arranged facing each other. The semiconductor device 176 may be arranged between the cooling plate 172 and the heating plate 174. The semiconductor device 176 may include a plurality of N type semiconductor elements and a plurality of P type semiconductor elements alternately arranged.

The cooling plate 172 may make contact with the upper surface 112 of the first PCB 110. The heating plate 174 may make contact with an inner surface of the heat sink 150. The cooling plate 172 may be attached to the upper surface 112 of the first PCB 110 using the first TIM 178. The heating plate 174 may be attached to an upper inner surface of the heat sink 150 using the first TIM 178. The first TIM 178 may include silicon, acrylic, resin, etc., not limited thereto.

When a current may be supplied to the heating plate 174, the current may flow along the N type semiconductor element 176, the cooling plate 172 and the P type semiconductor element 176. The heating plate 174 may be configured to dissipate the heat. In contrast, the cooling plate 172 may be configured to absorb the heat.

A voltage may be applied to the first TEC 170 to supply a current to the first TEC 170, thereby performing the Peltier effect from the first PEC 170. The voltage may be applied to the first TEC 170 through a terminal of the first PCB 110. For example, the current supplied to the heating plate 174 by the voltage may sequentially flow along the N type semiconductor element 176, the cooling plate 172 and the P type semiconductor element 176. The current may finally flow outside the first TEC 170 through the heating plate 174. During the current flow, the heat may be dissipated from the heating plate 174 and the heat may be absorbed in the cooling plate 172 by the Peltier effect. Therefore, the cooling plate 172, which may make contact with the central portion of the upper surface 112 of the first PCB 110 via the first TIM 178, may cool the central portion of the upper surface 112 of the first PCB 110. The above-mentioned current flows may be exemplarily illustrated. The current flows may be changed in accordance with structures and/or materials of the first TEC 170.

Therefore, because the first TEC 170 may directly cool the first PCB 110, the control chip 120, the DRAM chips 130 and the NAND flash memory chips 140 connected to the first PCB 110 may be indirectly cooled. Thus, it may not be required to additionally attach a plurality of the heat sinks 150 to the control chip 120, the DRAM chips 130 and the NAND flash memory chips 140.

Referring to FIG. 4, the first TEC 170 may be arranged on the central portion of the upper surface 112 of the first PCB 110. As mentioned above, because the most heat may be generated from the control chip 120, the central portion of the first PCB 110 at which the control chip 120 may be positioned may have a temperature higher than temperatures of other portions of the first PCB 110. Therefore, the first TEC 170 may be arranged at the central portion of the upper surface 112 of the first PCB 110 having the highest temperature to cool the central portion of the upper surface 112 of the first PCB 110. However, the control chip 120 may always not be positioned at the central portion of the first PCB 110. For example, the control chip 120 may be arranged adjacent to the connector 160. In this some example embodiments, the first TEC 170 may be positioned at the central portion of the first PCB 110 to cool a total temperature of the first PCB 110, thereby exhibiting improved cooling efficiency. Further, when it may be difficult to position the first TEC 170 at the central portion of the first PCB 110 due to arrangements of the control chip 120, the DRAM chips 130 and/or the NAND flash memory chips 140, the first TEC 170 may be positioned adjacent to the central portion of the first PCB 110 to more effectively cool the first PCB 110.

In example embodiments, the first TEC 170 may have an area of no more than about 50% of an area of the first PCB 110. However, the area of the first TEC 170 may not be restricted within a specific value.

Alternatively, when the control chip 120 may be arranged on the upper surface 112 of the first PCB 110, the first TEC 170 may be arranged on the lower surface 114 of the first PCB 110 opposite to the control chip 120.

The first temperature sensor 115 may measure the temperature of the first PCB 110 to control the operations of the first TEC 170. For example, when a temperature of the first PCB 110 measured by the first temperature sensor 115 may reach a maximum or upper critical temperature, the first TEC 170 may be operated to cool the first PCB 110. When a temperature of the first PCB 110 measured by the first temperature sensor 115 may reach a minimum or lower critical temperature, the first TEC 170 may be stopped.

In example embodiments, the first temperature sensor 115 may be arranged in or on the first PCB 110. Alternatively, the first temperature sensor 115 may be arranged in the control chip 120, the DRAM chips 130 and/or the NAND flash memory chips 140.

Figure 5:
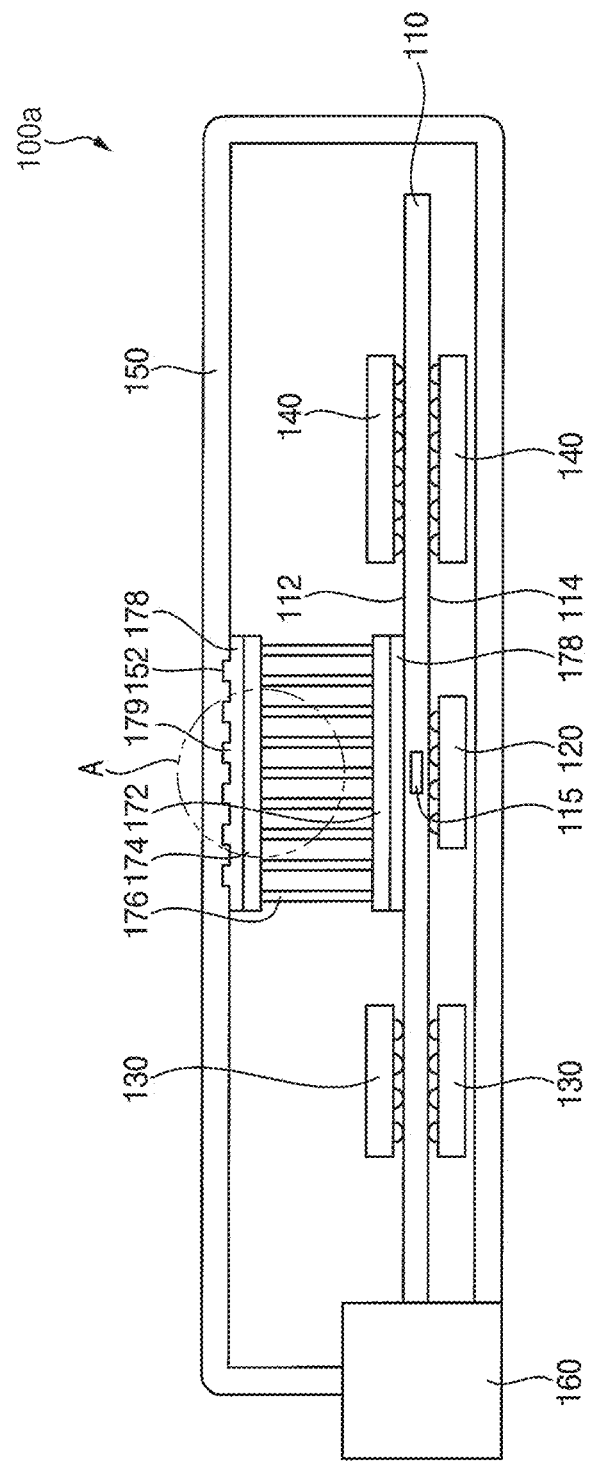
Figure 6:
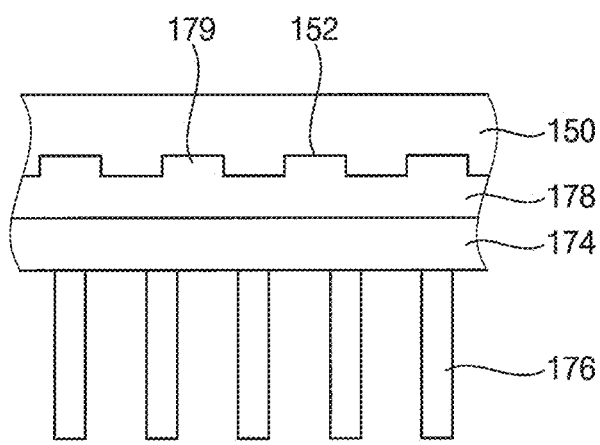

FIG. 5 is a cross-sectional view illustrating a semiconductor module in accordance with example embodiments, and FIG. 6 is an enlarged cross-sectional view of a portion "A" in FIG. 5.

A semiconductor module 100a of some example embodiments may include elements the same or substantially the same as those of the semiconductor module 100 in FIG. 1 except for shapes of the heat sink and the first TEC. Thus, the same reference numerals may refer to the same elements and any further illustrations with respect to the same elements may be omitted herein for brevity.

Referring to FIGS. 5 and 6, a first uneven groove 152 may be formed at an upper inner surface of the heat sink 150 configured to make contact with the heating plate 174 of the first TEC 170. The first TIM 178 interposed between the heating plate 174 of the first TEC 170 and the heat sink 150 may have a first uneven portion 179. The first uneven portion 179 may be formed on an upper surface of the first TIM 178. The first uneven portion 179 may be inserted into the first uneven groove 152. That is, the first uneven portion 179 may be configured to totally make contact with an inner surface of the first uneven groove 152. Shapes of the first uneven groove 152 and the first uneven portion 179 may not be restricted within a specific shape. For example, the first uneven groove 152 and the first uneven portion 179 may have a wave shape, a prominence and depression shape, etc.

The first uneven portion 179 of the first TIM 178 may be inserted into the first uneven groove 152 of the heat sink 150 to expand a contact area between the first TIM 178 and the heat sink 150. Thus, heat transfer efficiency from the heating plate 174 of the first TEC 170 to the heat sink 150 may be improved. Further, a functional position change of the first TEC 170 may be reduced or prevented.

Alternatively, when the semiconductor module 100a may not include the first TIM 178, that is, the heating plate 174 of the first TEC 170 may directly make contact with the inner surface of the heat sink 150, the first uneven portion 179 may be formed at an upper surface of the heating plate 174 of the first TEC 170.

Figure 7:
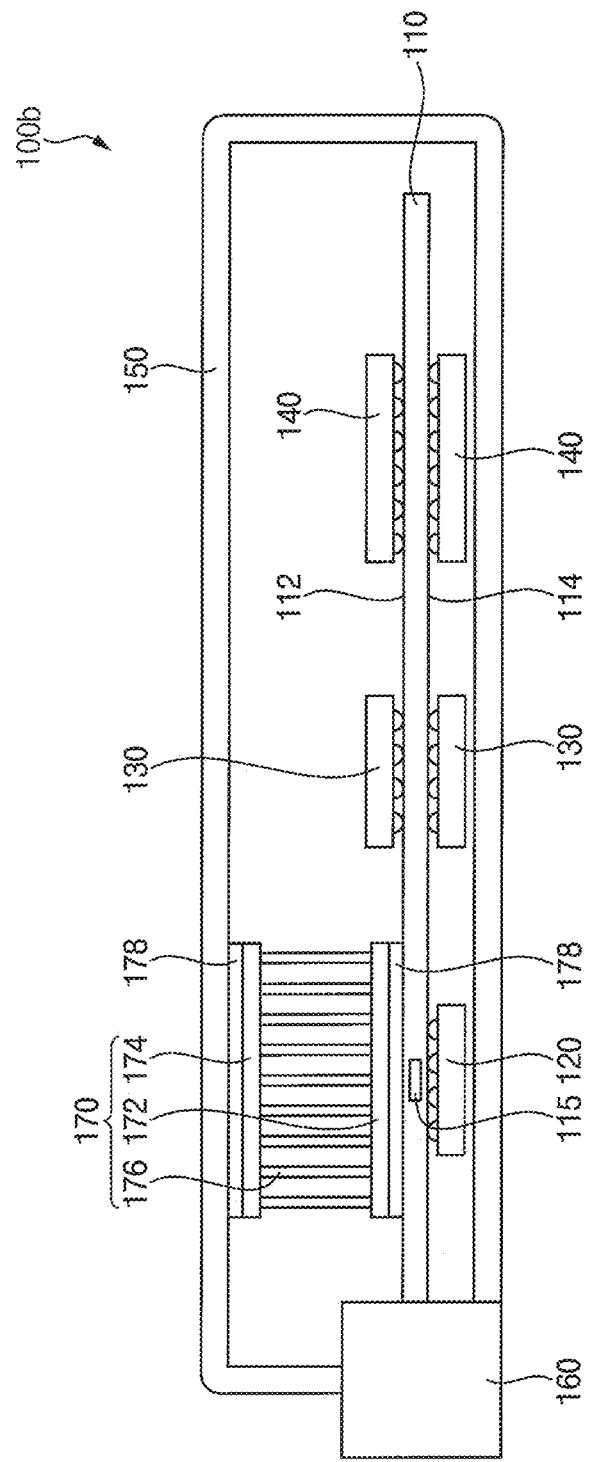

FIG. 7 is a cross-sectional view illustrating a semiconductor module in accordance with example embodiments.

A semiconductor module 100b of some example embodiments may include elements the same or substantially the same as those of the semiconductor module 100 in FIG. 1 except for positions of the control chip and the first TEC. Thus, the same reference numerals may refer to the same elements and any further illustrations with respect to the same elements may be omitted herein for brevity.

Referring to FIG. 7, the control chip 120 may be arranged at the left (or non-center) portion of the lower surface 114 of the first PCB 110. Thus, the first TEC 170 may be arranged at the left portion of the upper surface 112 of the first PCB 110 to more rapidly cool the left portion of the first PCB 110.

Figure 9:
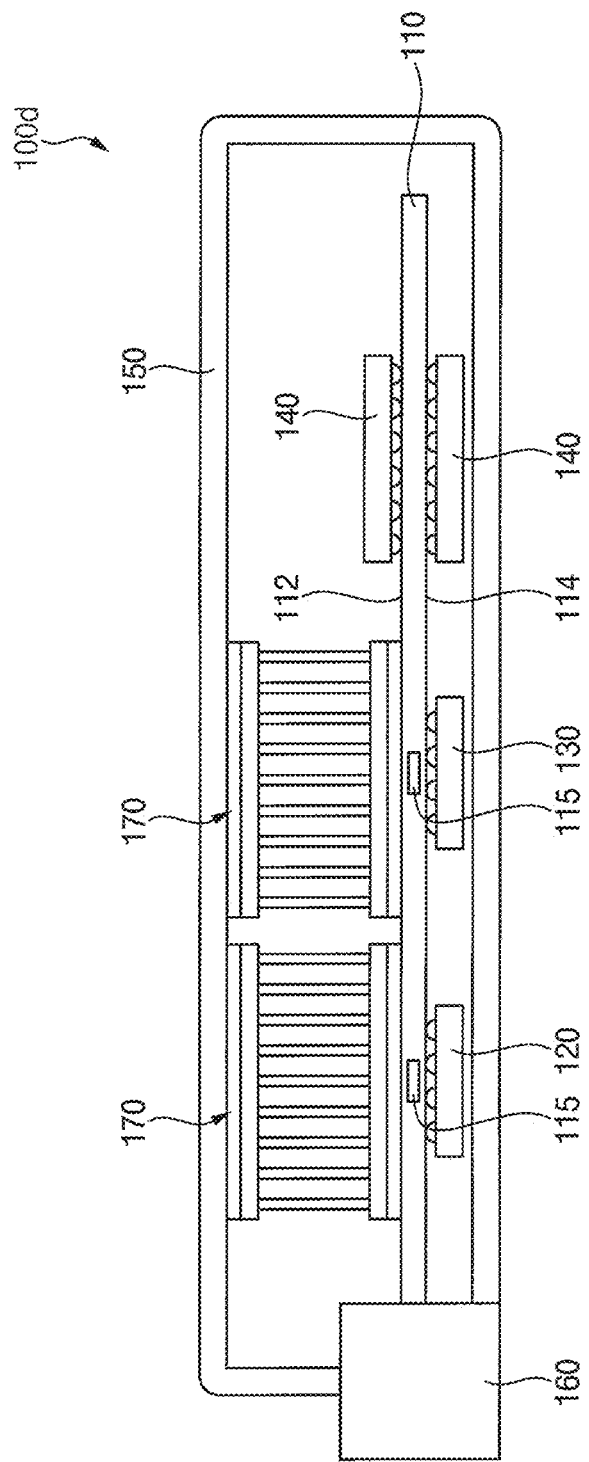

Alternatively, the upper portion of the inner surface of the heat sink 150 may have the uneven groove 152 in FIG. 5, and the first TIM 178 may have the uneven portion 179 in FIG. 9.

Figure 8:
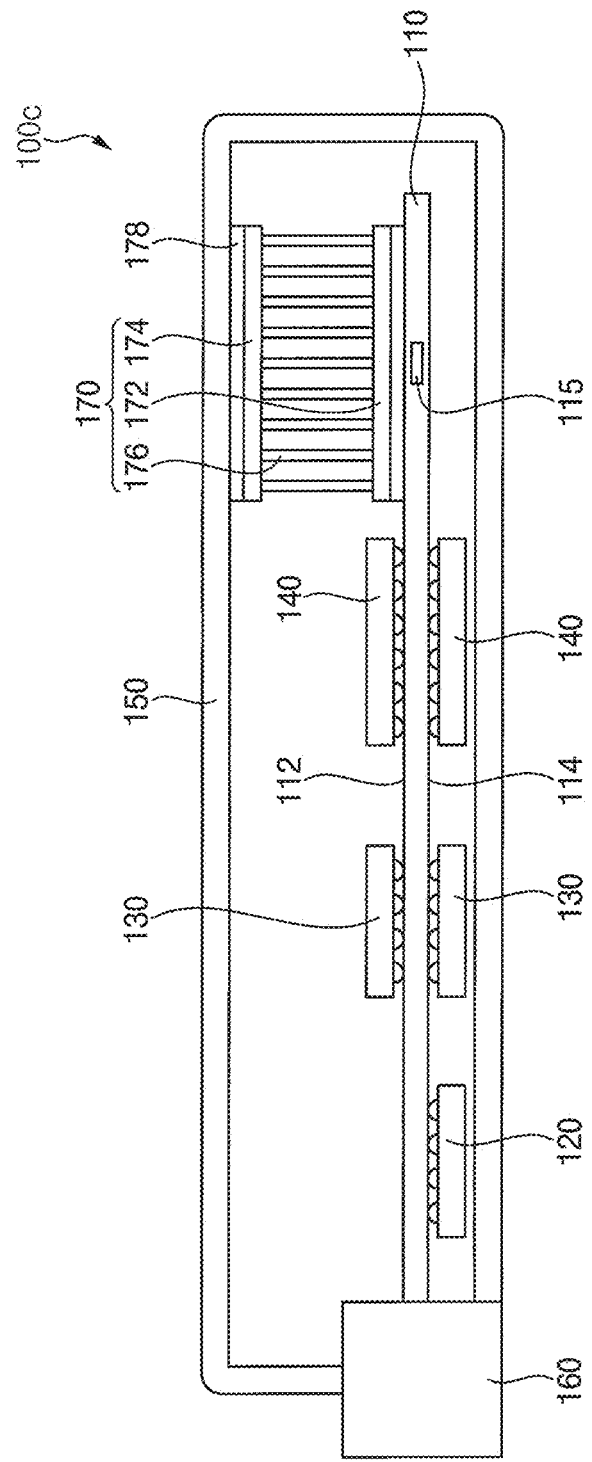

FIG. 8 is a cross-sectional view illustrating a semiconductor module in accordance with example embodiments.

A semiconductor module 100c of some example embodiments may include elements the same or substantially the same as those of the semiconductor module 100 in FIG. 1 except for a position of the first TEC. Thus, the same reference numerals may refer to the same elements and any further illustrations with respect to the same elements may be omitted herein for brevity.

Referring to FIG. 8, the first TEC 170 may be arranged at the right (or non-center) portion of the upper surface 112 of the first PCB 110. That is, the first TEC 170 may be positioned adjacent to the NAND flash memory chips 140. Thus, the first TEC 170 may more rapidly cool the right portion of the upper surface 112 of the first PCB 110 to which the heat may be transferred from the NAND flash memory chips 140.

Additionally, the semiconductor module 100c may further include the first TEC 170 in FIG. 7. Further, the upper inner surface of the heat sink 150 may have the uneven groove 152 in FIG. 5, and the first TIM 178 may have the uneven portion 179 in FIG. 9.

FIG. 9 is a cross-sectional view illustrating a semiconductor module in accordance with example embodiments.

A semiconductor module 100d of some example embodiments may include elements the same or substantially the same as those of the semiconductor module 100b in FIG. 7 except for a first TEC. Thus, the same reference numerals may refer to the same elements and any further illustrations with respect to the same elements may be omitted herein for brevity.

Referring to FIG. 9, the first TEC 170 may include at least two TECs horizontally arranged on the upper surface 112 of the first PCB 110. Thus, the horizontally arranged at least two TECs 170 may more rapidly cool the first PCB 110.

Alternatively, the upper inner surface of the heat sink 150 may have the uneven groove 152 in FIG. 5, and each of the first TIMs 178 interposed between the at least two first TECs 170 and the heat sink 150 may have the uneven portion 179 in FIG. 9.

Figure 10:
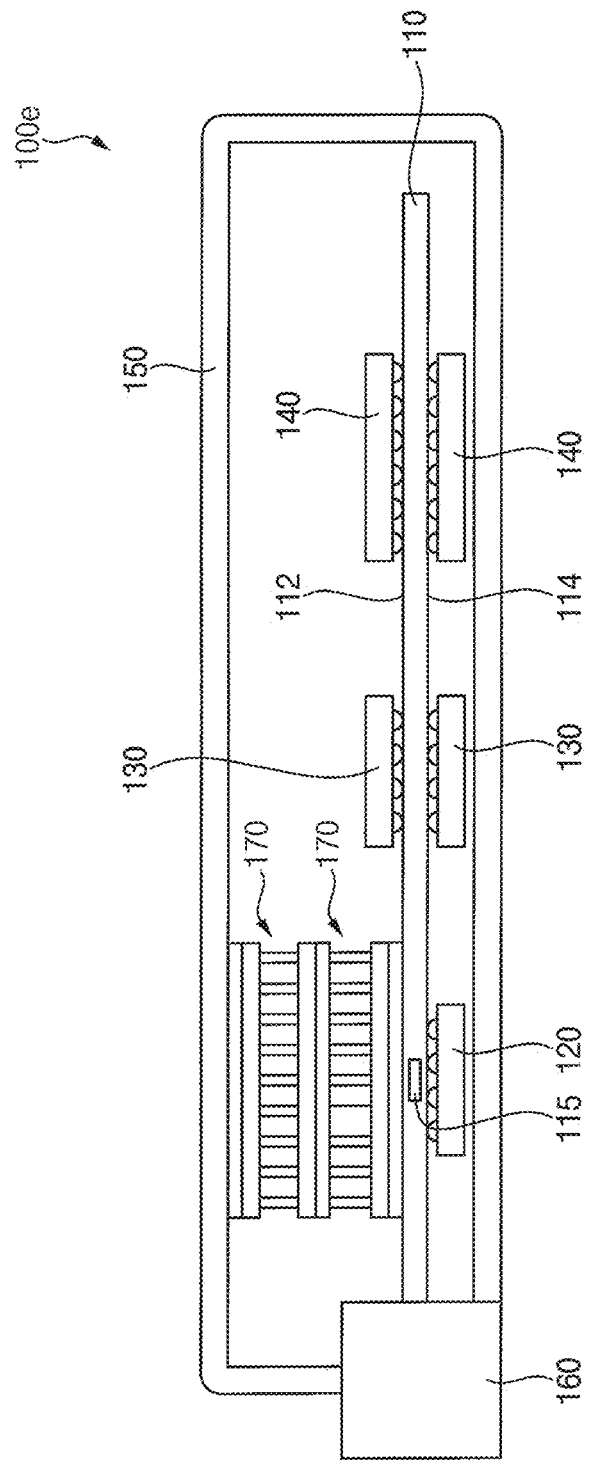

FIG. 10 is a cross-sectional view illustrating a semiconductor module in accordance with example embodiments.

A semiconductor module 100e of some example embodiments may include elements the same or substantially the same as those of the semiconductor module 100b in FIG. 7 except for a first TEC. Thus, the same reference numerals may refer to the same elements and any further illustrations with respect to the same elements may be omitted herein for brevity.

Referring to FIG. 10, the first TEC 170 may include at least two TECs vertically stacked on the upper surface 112 of the first PCB 110. Thus, the vertically stacked at least two TECs 170 may more rapidly cool the first PCB 110.

Alternatively, the upper inner surface of the heat sink 150 may have the uneven groove 152 in FIG. 5, and each of the first TIMs 178 interposed between an uppermost first TEC 170 among the vertically stacked first TECs 170 and the heat sink 150 may have the uneven portion 179 in FIG. 9.

Figure 11:
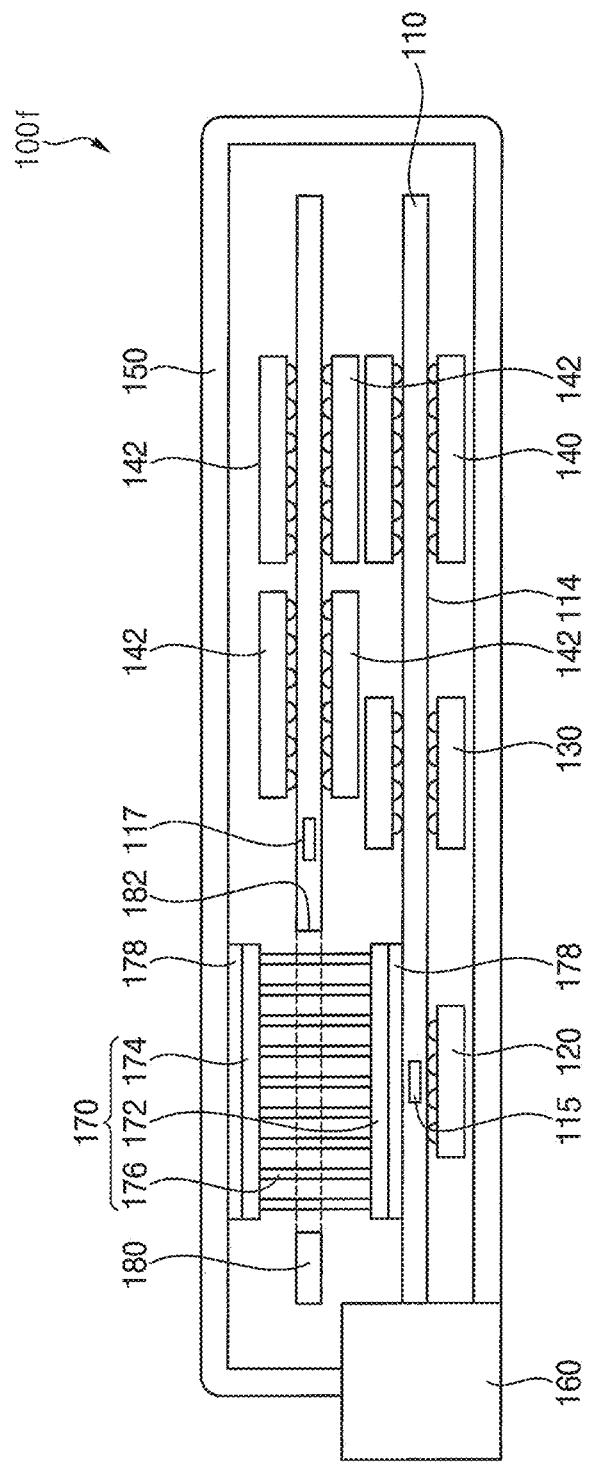

FIG. 11 is a cross-sectional view illustrating a semiconductor module in accordance with example embodiments.

A semiconductor module 100f of some example embodiments may include elements the same or substantially the same as those of the semiconductor module 100b in FIG. 7 except for further including a second PCB and a second temperature sensor. Thus, the same reference numerals may refer to the same elements and any further illustrations with respect to the same elements may be omitted herein for brevity. However, the semiconductor module 100f may not include the second temperature sensor.

Referring to FIG. 11, the semiconductor module 100f of some example embodiments may include the second PCB 180. The second PCB 180 may be arranged over the first PCB 110. Second NAND flash memory chips 142 (or other chips) may be arranged on an upper surface and a lower surface of the second PCB 180.

The second PCB 180 may have a hole 182. The hole 182 may be positioned over the first TEC 170. Thus, the first TEC 170 may pass through the hole 182 of the second PCB 180 to make contact with the upper inner surface of the heat sink 150.

The second temperature sensor 117 may measure a temperature of the second PCB 180 to control the operations of the first TEC 170. The second temperature sensor 117 may be arranged in or on the second PCB 180. Alternatively, the second temperature sensor 117 may be arranged in each of the NAND flash memory chips 142. Further, as mentioned above, the temperature control of the semiconductor module 100f may be performed only using the first temperature sensor 115 without the second temperature sensor 117.

Figure 12:
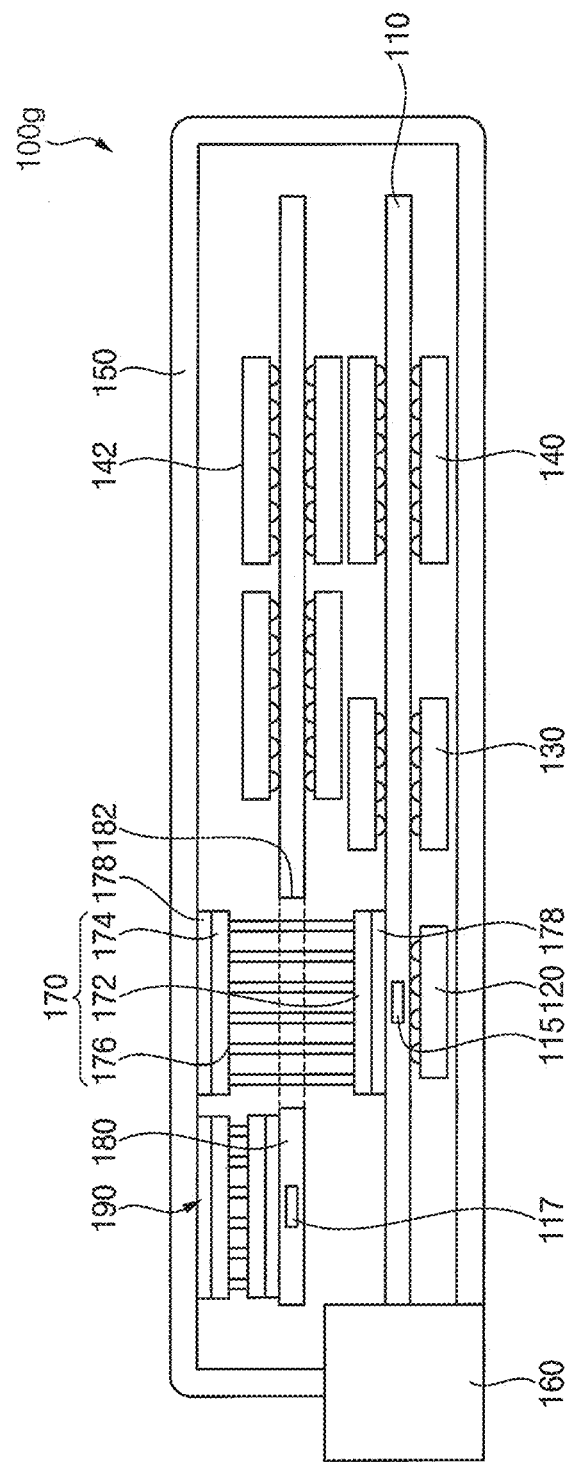

FIG. 12 is a cross-sectional view illustrating a semiconductor module in accordance with example embodiments.

A semiconductor module 100g of some example embodiments may include elements the same or substantially the same as those of the semiconductor module 100f in FIG. 11 except for further including a second TEC. Thus, the same reference numerals may refer to the same elements and any further illustrations with respect to the same elements may be omitted herein for brevity.

Referring to FIG. 12, the semiconductor module 100g of some example embodiments may further include a second TEC 190. The second TEC 190 may be arranged on the upper surface of the second PCB 180. The second TEC 190 may be configured to make contact with the upper inner surface of the heat sink 150. A second TIM 178a may be interposed between the second TEC 190 and the second PCB 180, and between the second TEC 190 and the heat sink 150. The second TIM 178a may include a material the same or substantially the same as the material of the first TIM 178 in FIG. 1.

The second TEC 190 may cool the second PCB 180. The second TEC 190 may have a structure and a function the same or substantially the same as those of the first TEC 170. Thus, any further illustrations with respect to the structure and the function of the second TEC 190 may be omitted herein for brevity.

Figure 13:
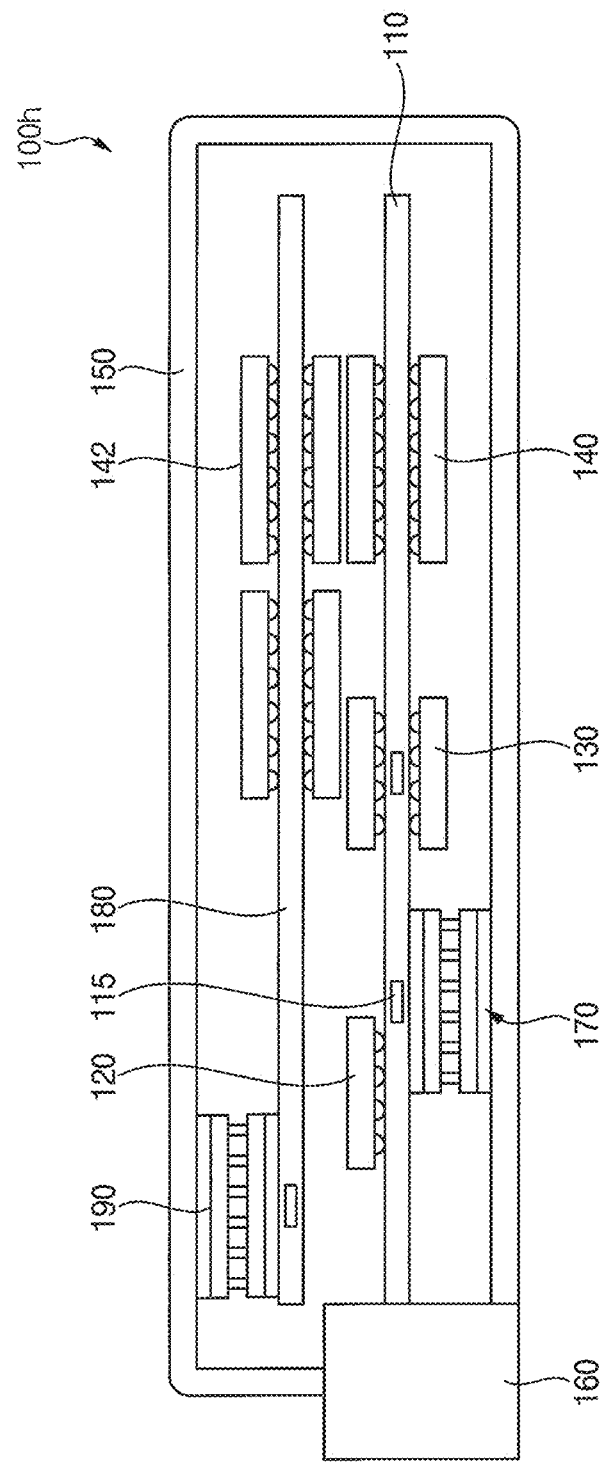

FIG. 13 is a cross-sectional view illustrating a semiconductor module in accordance with example embodiments.

A semiconductor module 100h of some example embodiments may include elements the same or substantially the same as those of the semiconductor module 100g in FIG. 12 except for a control chip, a first TEC and a second PCB. Thus, the same reference numerals may refer to the same elements and any further illustrations with respect to the same elements may be omitted herein for brevity.

Referring to FIG. 13, the control chip 120 may be arranged on the upper surface 112 of the first PCB 110. Thus, the first TEC 170 may be arranged on the lower surface 114 of the first PCB 110. As a result, the first TEC 170 may be configured to make contact with a lower portion of the inner surface of the heat sink 150.

Because the first TEC 170 on the lower surface 114 of the first PCB 110 may make contact with the lower inner surface of the heat sink 150, the second PCB 110 may not include a hole through which the first TEC 170 may pass.

Further, the lower inner surface of the heat sink 150 may have the uneven groove 152 in FIG. 5. The first TIM 178 interposed between the first TEC 170 and the heat sink 150 may have the uneven portion 179 in FIG. 9.

Figure 14:
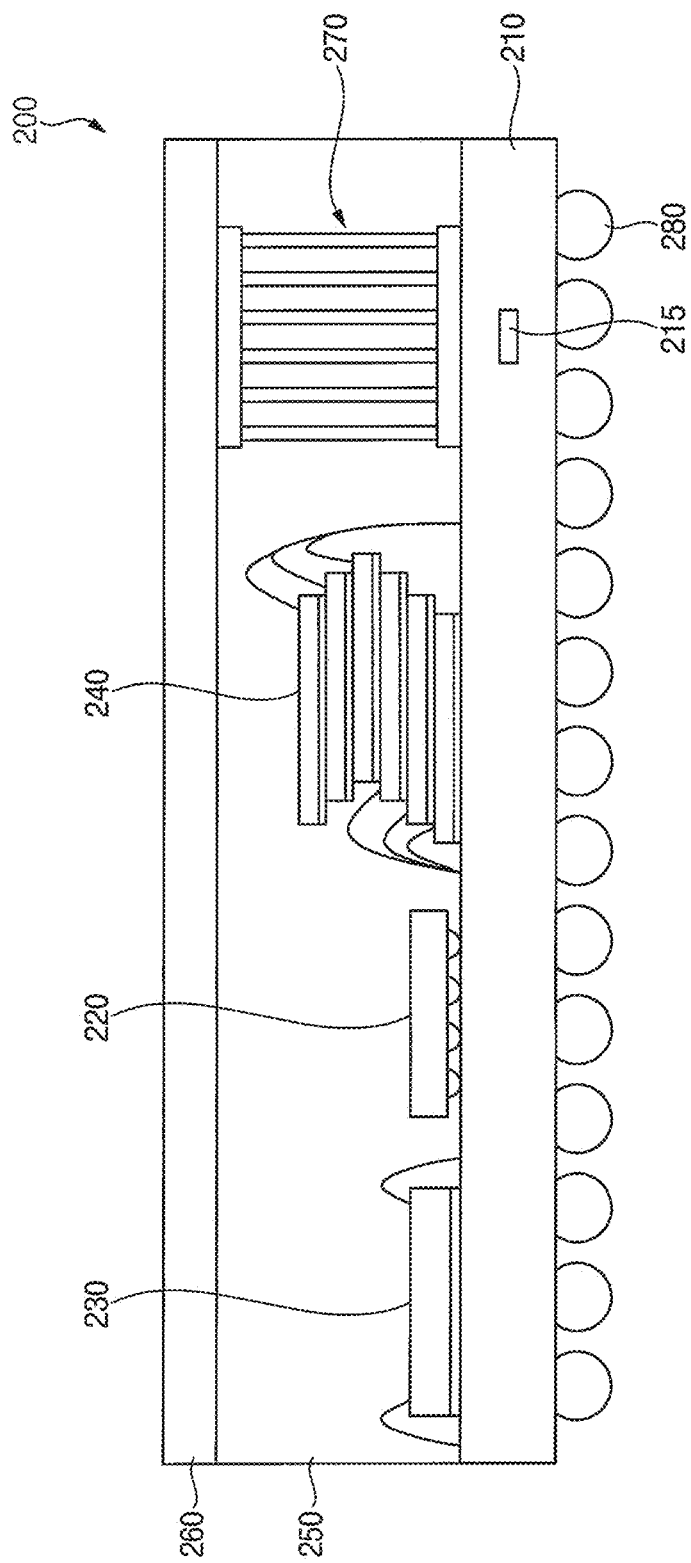

FIG. 14 is a cross-sectional view illustrating a semiconductor module in accordance with example embodiments.

Referring to FIG. 14, a semiconductor module 200 of some example embodiments may include a system-in package (SIP) or a multi-chip module. The semiconductor module 200 may include a PCB 210, a logic chip 220, a volatile memory chip 230, a non-volatile memory chip 240, a TEC 270, a temperature sensor 215, a molding member 250, a heat sink 260 and/or external terminals 280.

The logic chip 220, the volatile memory chip 230 and/or the non-volatile memory chip 240 may be arranged on an upper surface of the PCB 210. The external terminals 280 may be arranged on a lower surface of the PCB 210.

The TEC 270 may be arranged on the upper surface of the PCB 210. The TEC 270 may have a structure and a function the same or substantially the same as those of the TEC 170 in FIG. 1. Thus, any further illustrations with respect to the structure and the function of the TEC 270 may be omitted herein for brevity.

The temperature sensor 215 may measure a temperature of the PCB 210 to control operations of the TEC 270. The temperature sensor 215 may be arranged in or on the PCB 210. Alternatively, the temperature sensor 215 may be arranged in the logic chip 220, the volatile memory chip 230 and/or the non-volatile memory chip 240.

The molding member 250 may be formed on the upper surface of the PCB 210 to cover the logic chip 220, the volatile memory chip 230 and the non-volatile memory chip 240. Further, the molding member 250 may be configured to surround side surfaces of the TEC 270 except for an upper surface of the TEC 270. Thus, the upper surface of the TEC 270 may be upwardly exposed.

The heat sink 260 may be arranged on an upper surface of the molding member 250. The heat sink 260 may be configured to make contact with the exposed upper surface of the TEC 270. Thus, heat may be transferred from a heating plate of the TEC 270 to the heat sink 260.

Figure 15:
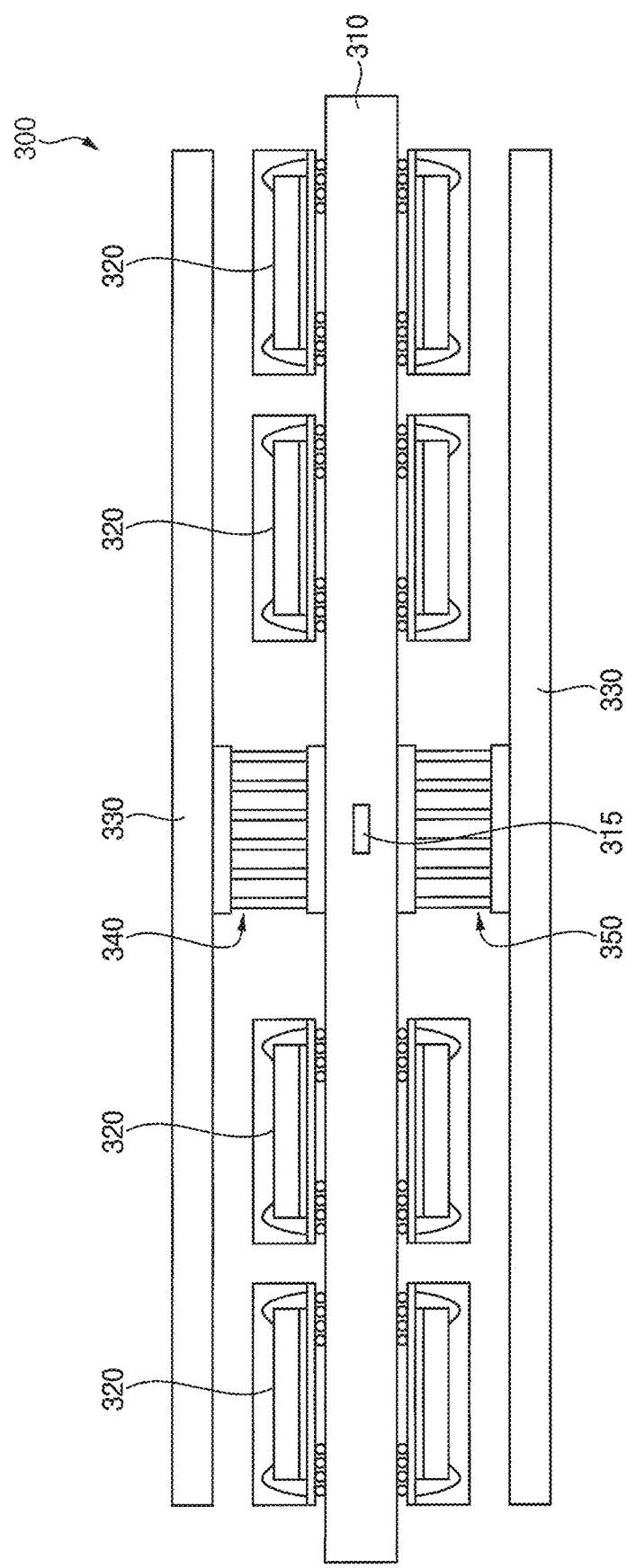

FIG. 15 is a cross-sectional view illustrating a semiconductor module in accordance with example embodiments.

Referring to FIG. 15, a semiconductor module 300 of some example embodiments may include a memory module. The semiconductor module 300 may include a PCB 310, a plurality of volatile memory chips 320, heat sinks 330, upper and lower TECs 340 and 350 and a temperature sensor 315.

The volatile memory chips 320 may be arranged on an upper surface and a lower surface of the PCB 310. The heat sinks 330 may be spaced apart from the upper surface and the lower surface of the PCB 310.

The upper TEC 340 may be arranged between the upper surface of the PCB 310 and the heat sink 330. The lower TEC 350 may be arranged between the lower surface of the PCB 310 and the heat sink 330. Each of the upper and lower TECs 340 and 350 may have a structure and a function the same or substantially the same as those of the TEC 170 in FIG. 1. Thus, any further illustrations with respect to the structure and the function of the upper and lower TECs 340 and 350 may be omitted herein for brevity.

The temperature sensor 315 may measure a temperature of the PCB 310 to control operations of the upper and lower TECs 340 and 350. The temperature sensor 315 may be arranged in or on the PCB 310. Alternatively, the temperature sensor 315 may be arranged in the volatile memory chips 320.

Alternatively, the semiconductor module 300 may include only one of the upper and lower TECs 340 and 350.

Figure 16:
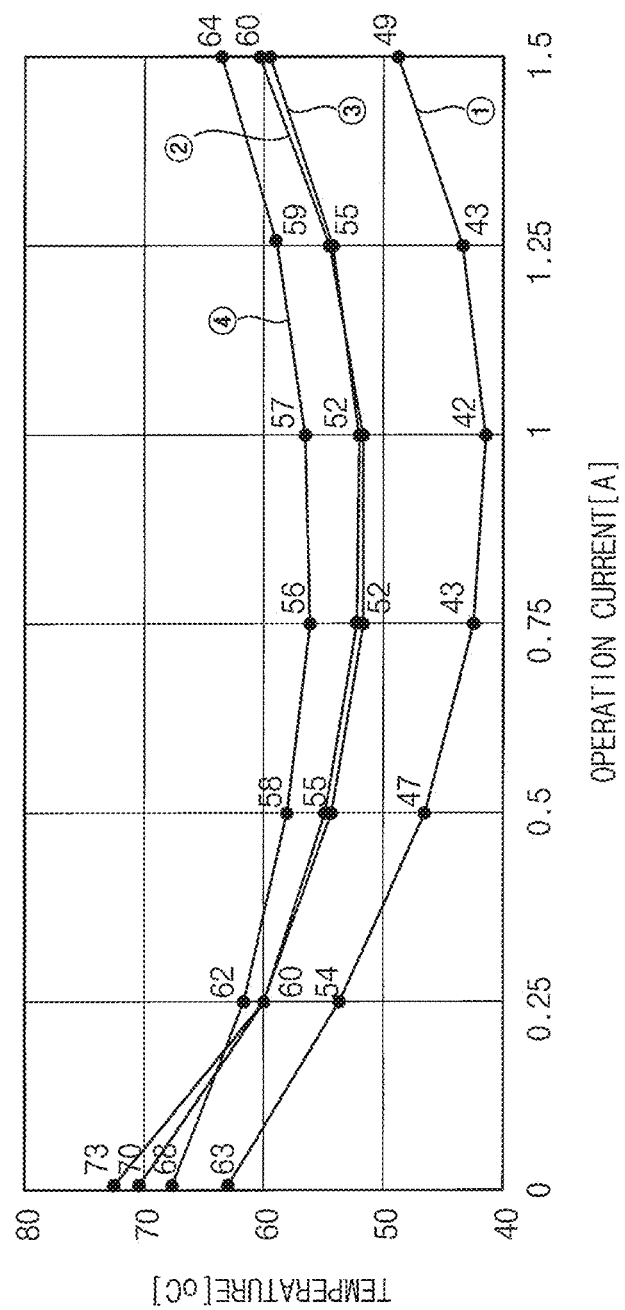

FIG. 16 is a graph showing temperatures of parts in the semiconductor module cooled by a TEC in FIG. 1. In FIG. 16, a horizontal axis may represent a current and a vertical axis may represent a temperature. Further, in FIG. 16, a line ① may represent a temperature of a PCB, a line ② may represent a temperature of a control chip, a line ③ may represent a temperature of a DRAM chip, and a line ④ may represent a temperature of a NAND flash memory chip.

As shown in FIG. 16, when the TEC may be operated, the TEC may directly cool the PCB. Thus, during the PCB may be directly cooled, it can be noted that the control chip, the DRAM chip and the NAND flash memory chip connected to the control chip may be indirectly cooled.

According to example embodiments, the first TEC may be arranged on the first PCB to more rapidly cool the heat transferred from the semiconductor chip to the first PCB. Thus, performances of the semiconductor module may not be deteriorated by the heat.

For example, the first TEC may directly cool the first PCB so that the semiconductor chips connected to the first PCB may be indirectly cooled. Therefore, it may not be required to attach heat sinks to the semiconductor chips, respectively.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor module comprising:
    a first printed circuit board (PCB);
    a plurality of first memory chips on an upper surface and a lower surface of the first PCB;
    a control chip on the lower surface of the first PCB;
    a heat sink configured to surround the first PCB, the first memory chips and the control chip;
    at least one first thermoelectric cooler (TEC) on the upper surface of the first PCB to cool heat from the first PCB;
    a first thermal interface material (TIM) between the first TEC and the first PCB, and between the first TEC and the heat sink; and
    a first temperature sensor configured to measure a temperature of the first PCB for controlling operations of the first TEC,
    wherein a first uneven groove is at an inner surface of the heat sink configured to make contact with the first TEC, the first TIM includes a first uneven portion in the first uneven groove, and the first TEC has an area of no more than about 50% of an area of the first PCB.

2. The semiconductor module of claim 1, further comprising:
    a second PCB over the first PCB;
    a plurality of second memory chips on an upper surface and a lower surface of the second PCB;
    at least one second TEC on the upper surface of the second PCB to transfer heat from the second PCB to the heat sink;
    a second TIM between the second TEC and the second PCB, and between the second TEC and the heat sink; and
    a second temperature sensor configured to measure a temperature of the second PCB for controlling operations of the second TEC.

3. The semiconductor module of claim 2, wherein the second PCB has a hole through which the first TEC passes.

4. The semiconductor module of claim 2, wherein a second uneven groove is at an inner surface of the heat sink configured to make contact with the second TEC, and the second TIM includes a second uneven portion in the second uneven groove.

5. A semiconductor module comprising:
    a first PCB;
    a plurality of first memory chips on an upper surface and a lower surface of the first PCB;
    at least one control chip on the lower surface of the first PCB;
    a heat sink configured to surround the first PCB, the first memory chips and the control chip; and
    at least one first TEC on the upper surface of the first PCB overlapping the at least one control chip, the at least one first TEC configured to cool heat from the first PCB,
    wherein the heat sink has a first uneven groove at an inner surface of the heat sink configured to make contact with the first TEC.

6. The semiconductor module of claim 5, further comprising a first TIM between the first TEC and the first PCB, and between the first TEC and the heat sink.

7. The semiconductor module of claim 6, wherein the first TIM includes a first uneven portion in the first uneven groove.

8. The semiconductor module of claim 5, further comprising a first temperature sensor configured to measure a temperature of the first PCB for controlling operations of the first TEC.

9. The semiconductor module of claim 5, further comprising:
    a second PCB over the first PCB;
    a plurality of second memory chips on an upper surface and a lower surface of the second PCB;
    at least one second TEC on the upper surface of the second PCB to transfer heat from the second PCB to the heat sink;

a second TIM between the second TEC and the second PCB, and between the second TEC and the heat sink; and a second temperature sensor configured to measure a temperature of the second PCB for controlling operations of the second TEC.

10. The semiconductor module of claim 9, wherein the second PCB has a hole through which the first TEC passes.

11. A semiconductor module comprising:
a first PCB;
at least one first semiconductor chip on a lower surface of the first PCB;
a heat sink configured to surround the first PCB and the first semiconductor chip; and
at least one first TEC on an upper surface of the first PCB overlapping the at least one first semiconductor chip, the at least on first TEC configured to cool heat from the first PCB,
wherein the heat sink has a first uneven groove at an inner surface of the heat sink configured to make contact with the first TEC.

12. The semiconductor module of claim 11, further comprising a first TIM between the first TEC and the first PCB, and between the first TEC and the heat sink.

13. The semiconductor module of claim 12, wherein the first TIM includes a first uneven portion in the first uneven groove.

14. The semiconductor module of claim 11, further comprising a first temperature sensor configured to measure a temperature of the first PCB for controlling operations of the first TEC.

15. The semiconductor module of claim 11, wherein the first TEC is arranged at a central portion of the first PCB.

16. The semiconductor module of claim 11, wherein the first semiconductor chip comprises a control chip.

17. The semiconductor module of claim 11, wherein the first semiconductor chip comprises a first memory chip.

18. The semiconductor module of claim 11, further comprising:
a second PCB over the first PCB;
at least one second memory chip at the second PCB;
at least one second TEC at the second PCB to cool heat from the second PCB; and
a second TIM between the second TEC and the second PCB, and between the second TEC and the heat sink.

19. The semiconductor module of claim 18, wherein a second uneven groove is at an inner surface of the heat sink configured to make contact with the second TEC, and the second TIM includes a second uneven portion in the second uneven groove.

20. The semiconductor module of claim 18, further comprising a second temperature sensor configured to measure a temperature of the second PCB for controlling operations of the second TEC.

* * * * *